United States Patent
Ogino et al.

(10) Patent No.: US 8,147,234 B2
(45) Date of Patent: Apr. 3, 2012

(54) IMPRINT APPARATUS AND METHOD FOR FINE STRUCTURE LITHOGRAPHY

(75) Inventors: Masahiko Ogino, Hitachi (JP); Mitsuru Hasegawa, Hitachi (JP); Akihiro Miyauchi, Hitachi (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 0 days.

(21) Appl. No.: 12/343,550

(22) Filed: Dec. 24, 2008

(65) Prior Publication Data

US 2009/0166914 A1   Jul. 2, 2009

(30) Foreign Application Priority Data

Dec. 27, 2007   (JP) .................. 2007-335513

(51) Int. Cl.
   *B29C 59/04*   (2006.01)
(52) U.S. Cl. ........................................ 425/373; 264/284
(58) Field of Classification Search .................. 264/284; 425/373
   See application file for complete search history.

(56) References Cited

U.S. PATENT DOCUMENTS

| | | | |
|---|---|---|---|
| 4,486,363 A * | 12/1984 | Pricone et al. | 264/1.36 |
| 5,772,905 A | 6/1998 | Chou | |
| 6,756,002 B2 * | 6/2004 | Fujii et al. | 264/210.2 |
| 2004/0130057 A1 * | 7/2004 | Mehrabi et al. | 264/171.13 |
| 2008/0001316 A1 * | 1/2008 | Jain et al. | 264/1.1 |
| 2008/0299247 A1 | 12/2008 | Ogino | |
| 2009/0087506 A1 | 4/2009 | Hasegawa | |

FOREIGN PATENT DOCUMENTS

| | | |
|---|---|---|
| JP | 03-230334 | 10/1991 |
| JP | 2005-153091 | 6/2005 |
| JP | 2007-287942 | 11/2007 |

* cited by examiner

*Primary Examiner* — Christina Johnson
*Assistant Examiner* — Galen Hauth
(74) *Attorney, Agent, or Firm* — Antonelli, Terry, Stout & Kraus, LLP.

(57) ABSTRACT

An imprint apparatus for forming fine structure lithography comprises: a belt-like mold having a fine structure for imprint lithography formed on a surface of the belt-like mold; a cylindrical pressurizing mechanism including a pair of opposed rolls for pressurizing the belt-like mold against the surface of the imprinting object; and a supporting member for supporting the imprinting object at a position between the rolls of the cylindrical pressurizing mechanism. The belt-like mold, the imprinting object and the supporting member are configured to move to the cylindrical pressurizing mechanism in a mutually non-contact state, and then at the position between the rolls, be pressurized by the cylindrical pressurizing mechanism in a state where the imprinting object is positioned between the belt-like mold and the supporting member.

9 Claims, 4 Drawing Sheets

IMPRINT APPARATUS AND METHOD FOR FINE STRUCTURE LITHOGRAPHY

CLAIM OF PRIORITY

The present application claims priority from Japanese patent application serial no. 2007-335513, filed on Dec. 27, 2007, the content of which is hereby incorporated by reference into this application.

FIELD OF THE INVENTION

The present invention relates to an imprint apparatus for forming a fine concave-convex pattern as fine structure lithography on a surface of an imprinting object by pressing a mold having the fine concave-convex pattern formed on its surface against the imprinting object, and to a method for forming the pattern using the same.

BACKGROUND OF THE INVENTION

In recent years, semiconductor integrated circuits have been increasingly microfabricated and integrated. In order to achieve such a microfabrication process, photolithography devices have been developed as a pattern transferring technique to have a higher degree of accuracy. However, the microfabrication process has approached the wavelength of a light source of an exposure device, and thus the photolithography technique has also been approaching its limit. Thus, an electron-beam drawing device, which is a type of charged particle beam equipment, has come into use to further promote microfabrication and enhance the accuracy, in place of the photolithography technique.

Patterning using electron beams involves drawing a mask pattern, unlike one-shot exposure method in patterning using a light source, such as an i-line or an excimer laser. Thus, the larger the number of patterns to be drawn, the longer the exposure (drawing) time, which disadvantageously takes a considerable time for patterning. For this reason, a dramatic rise in the degree of integration to, in turn, 256 megabits, 1 gigabit, and 4 gigabits causes a correspondingly dramatic increase in patterning time, which may lead to large degradation in throughput. A collective figure irradiation method has been developed which involves collectively irradiating a combination of masks having various shapes with electron beams at a time, thereby yielding electron beams in complicated form so as to speed up the electron beam drawing device. As a result, the microfabrication of the pattern has been promoted, while the electron beam drawing device has to be upsized, but a mechanism for more accurately controlling the positions of the masks is required, which results in high cost of the device.

On the other hand, techniques for forming the fine patterns at low cost are disclosed in, for example, U.S. Pat. No. 5,772,905 and JP-A-03-230334. Those techniques involve pressing a mold having the same concave-convex pattern as that to be formed on an imprinting object against a resist film layer formed on a surface of an imprinting substrate, thereby imprinting the predetermined pattern onto the resist layer. In particular, a nanoimprint technique as described in U.S. Pat. No. 5,772,905 can form a fine structure having a size of 25 nanometers or less by imprinting using a silicon wafer as a mold.

The imprinting method as disclosed in U.S. Pat. No. 5,772,905 involves putting a mold on a substrate coated with resin, mounting the substrate and the mold on a stage of a parallel flat plate type press device which enables heating and pressurizing, heating the substrate and the mold at a temperature equal to or more than a glass transition temperature of the resin, and then pressurizing them. The imprinting method further involves cooling the substrate and the mold down to a temperature equal to or less than the glass transition temperature, and separating the mold from the substrate thereby to perform imprinting of the pattern.

Further, JP-A-03-230334 discloses a method for imprinting a pattern by means of a heating and pressurizing roller while conveying a continuous film-like substrate. The patent document has reported that the method suppresses deformation of the pattern on the substrate, thereby surely enabling the imprinting of the concave-convex pattern.

However, the method disclosed in U.S. Pat. No. 5,772,905 takes long time to perform one-time imprinting because imprinting of the pattern onto the substrate needs processes of heating, pressurizing, cooling, and separating in turn, which makes it difficult to produce fine structures in quantity. On the other hand, the method disclosed in JP-A-03-230334, which involves imprinting the pattern by the heating and pressurizing roller while conveying the continuous film-like substrate, can continuously imprint the pattern onto the imprinting object. The method can be expected to perform the imprinting over a large area at high throughput. The inventors have tried the method disclosed in JP-A-03-230334 to imprint a pattern onto a thin film-like substrate, but have apparently found that wrinkled traces occurred in the object subjected to imprinting.

SUMMARY OF THE INVENTION

In view of the above-mentioned technical problems, it is an object of the invention to achieve an imprint apparatus and a fine structure imprinting method which can prevent occurrence of imprinting failure, such as a wrinkled trace, at high throughput.

The inventors have thought that the cause of difficulty in mass-production of fine structures is the performance of heating, pressurizing, cooling, and separating only on one stage. Further, the cause of occurrence of the imprinting failure, such as the wrinkled trace, is due to thermal deformation caused in the imprinting object by heating, pinching, and pressing the components with different properties. Thus, the invention has been made based on such findings.

That is, the invention is directed to an imprint apparatus and a fine structure imprinting method for forming a fine structure lithography for a short time without any imprinting failure, such as wrinkled traces. The imprint apparatus for forming a fine structure lithography on a surface of an imprinting object comprises a belt-like mold having a fine structure for imprint lithography formed on a surface of the belt-like mold;

a cylindrical pressurizing mechanism including a pair of opposed rolls for pressurizing the belt-like mold against the surface of the imprinting object; and a supporting member for supporting the imprinting object at a position between the rolls of the cylindrical pressurizing mechanism. The belt-like mold, the imprinting object and the supporting member are configured to move to the cylindrical pressurizing mechanism in a mutually non-contact state, and then at the position between the rolls, be pressurized by the cylindrical pressurizing mechanism in a state where the imprinting object is positioned between the belt-like mold and the supporting member.

Accordingly, the invention can provide the imprint apparatus and the fine structure imprinting method which can prevent occurrence of the imprinting failure, such as wrinkled traces, at high throughput.

DETAILED DESCRIPTION OF THE PREFERRED EMBODIMENTS

Figure 1:
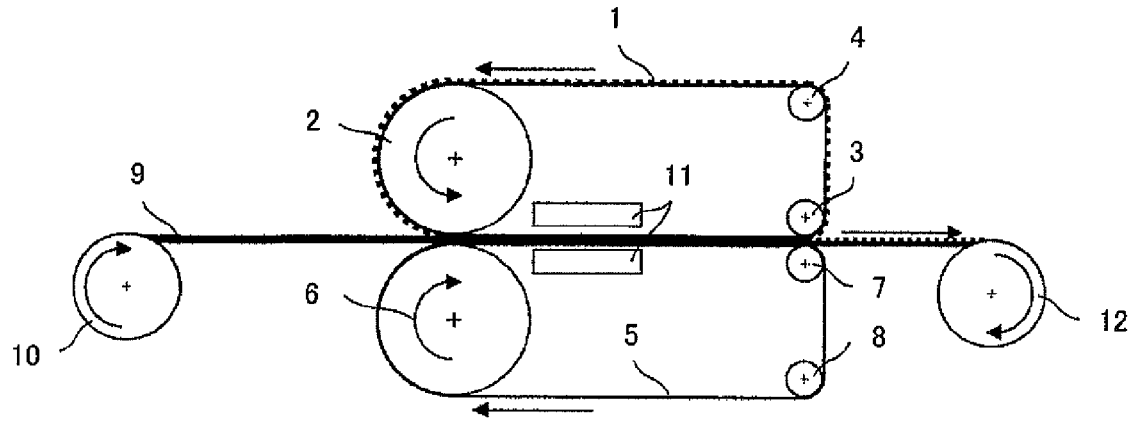
FIG. 1 is a schematic diagram of an imprint apparatus according to one embodiment of the invention.

First, an imprint apparatus and an imprinting method according to the invention will be described below. FIG. 1 is a schematic diagram of the imprint apparatus in one example showing a best mode of the invention. The nanoimprint apparatus of the embodiment includes a belt-like mold 1 having a fine structure formed thereon, a cylindrical pressurizing mechanism having a pair of opposed rolls for pressurizing the belt-like mold 1 against the surface of an imprinting object 9 (the rolls are comprised of an upper roll 2 of the cylindrical pressurizing mechanism, and a lower roll 6 of the cylindrical pressurizing mechanism), and a supporting member 5 supporting the imprinting object at a position between the rolls of the cylindrical pressurizing mechanism. The belt-like mold 1 is looped over three of the upper roll 2 of the cylindrical pressurizing mechanism, an upper roll 3 of a separating mechanism and a supporting roll 4 so as to enable to move endlessly. The belt-like supporting member 5 is looped over three of the lower roll 6 of the cylindrical pressurizing mechanism, a lower roll 7 of the separating mechanism and a supporting roll 8. The strip-shaped imprinting object 9 is fed from a feed roll 10 to the pressurizing mechanism, and wound by a winding roll 12. In the apparatus, the belt-like mold 1, the imprinting object 9, and the supporting member 5 move to the pressurizing mechanism in a non-contact state, and then are pressurized by the pressurizing mechanism while the imprinting object 9 is positioned between the belt-like mold 1 and the supporting member 5.

Figure 2:
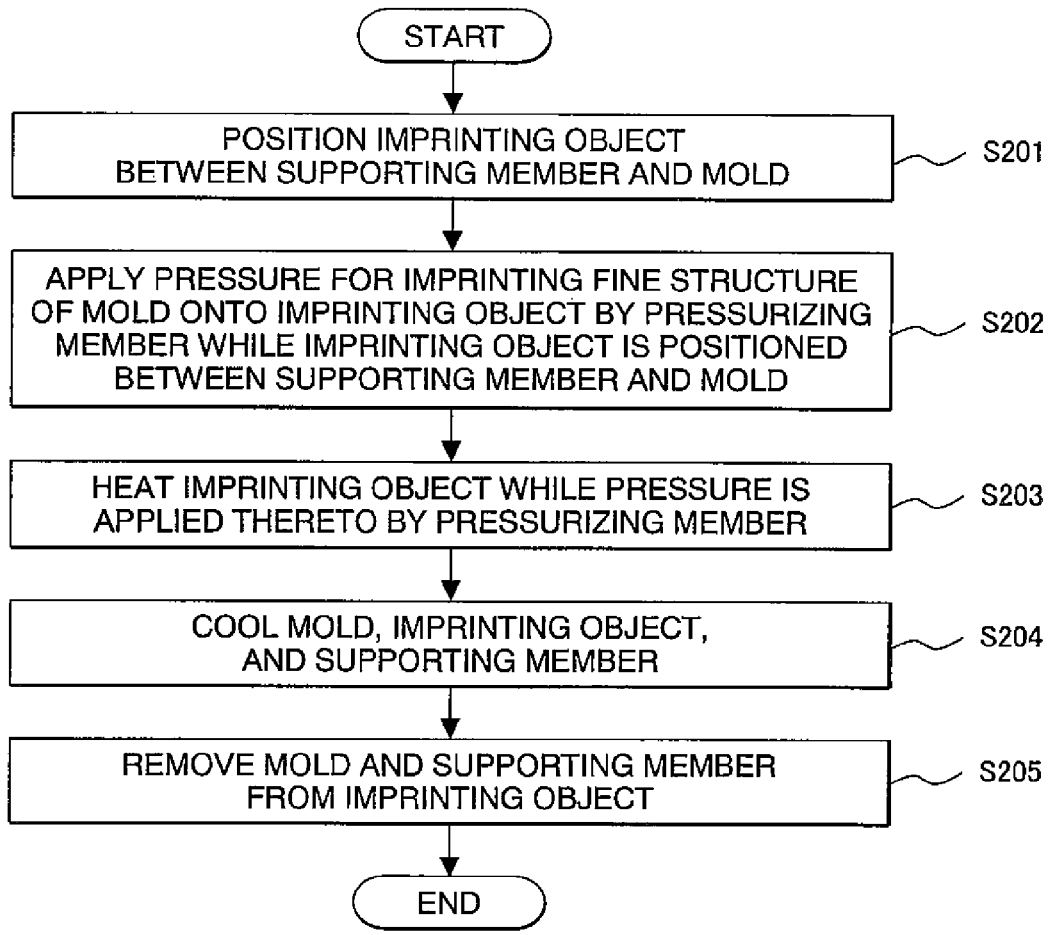
FIG. 2 is a flowchart for explaining imprinting steps in the invention.

Now, a fine structure imprinting method of the invention will be described below using a flowchart shown in FIG. 2. First, the imprinting object is positioned between the mold and a supporting member for supporting the imprinting object (step S201). Then, pressure is applied to the imprinting object by the pressurizing member to imprint the fine structure of the mold onto the imprinting object while the imprinting object is positioned between the supporting member and the mold (step S202). The imprinting object is heated while the pressure is applied by the pressurizing member to be softened, whereby the fine structure of the mold is imprinted onto the imprinting object (step S203). Although the heating in step S203 is performed after the pressurizing in step S202, the same pressurizing process as that in step S202 and the heating process as that in step S203 may be simultaneously performed. Note that heating before pressurizing while the mold, the supporting member and the imprinting object are in contact with each other is apt to cause the wrinkled traces upon imprinting, which is not preferable. Then, after imprinting the fine structure of the mold onto the imprinting object in steps S202 and S203, the mold, the imprinting object and the supporting member are cooled to a predetermined temperature (step S204). Thereafter, the mold and the supporting member are separated from the imprinting object (step S205). The processes in the steps described above imprint the fine structure of the mold onto the imprinting object, thereby enabling improvement of the imprinting failure, such as a wrinkled trace.

Specifically, the fine structure imprinting method in use of the imprint apparatus of the invention will be described below. The imprinting object 9 is fed from the feed roll 10, and then moved to the pressurizing mechanism in the non-contact state with respect to the belt-like mold 1 and the supporting member 5, whereby the imprinting object 9 is fed to the pressurizing mechanism while being positioned between the belt-like mold 1 and the supporting member 5. The belt-like mold 1, the imprinting object 9 and the supporting member 5 are pinched and pressed by the pressurizing mechanism to be pressurized in contact with each other. The pressurizing mechanism is provided with heating means. The imprinting object 9 is heated in being pressurized by the pressurizing mechanism. Thereafter, the belt-like mold 1, the imprinting object 9, and the supporting member 5 are cooled by a cooling mechanism 11 while being in closely contact with one another, and moved to the separating mechanism including two rolls. Then, the belt-like mold 1 and the supporting member 5 are separated from the imprinting object 9 by the separating mechanism, so that the fine structure lithography is formed on the surface of the imprinting object 9. Thereafter, the imprinting object 9 having the fine structure formed thereon is wound by the winding roll 12.

In this way, the imprinting object is continuously fed, heated, and pressurized between the belt-like mold and the supporting member, whereby the fine pattern can be continuously formed on the substrate surface of the imprinting object thereby to form the fine structure lithography for a short time. Further, the belt-like mold, the supporting member and the imprinting object are moved to the pressurizing mechanism in the non-contact state, and then the imprinting object is pinched and heated by the cylindrical pressurizing mechanism between the belt-like mold and the supporting member, so that the mold, the imprinting object, and the supporting member can be pressurized without thermal stress. Thus, the occurrence of wrinkles due to a difference in property between the components is suppressed, which improves the imprinting failure, such as the wrinkled trace. The supporting member preferably has the same property as that of the belt-like mold. Thus, the imprinting object is heated while being pinched and pressed by the cylindrical pressurizing mechanism between the belt-like mold and the supporting member which have similar properties to each other. The structure after the imprinting process is symmetrically pressurized and heated thereby to suppress the occurrence of wrinkles due to the difference in property, thus improving the imprinting failure, such as the wrinkled trace.

The separating mechanism is provided at a post-cylindrical pressurizing mechanism position. The imprinting object, the mold, and the supporting member are pressurized and heated, and then moved in the closely contact up to the separating mechanism. The imprinting object is continuously cooled, and separated from the mold and the supporting member by the separating mechanism, so that the good imprinting of the pattern can be performed at high velocity without causing the deformation or the like of the imprinted pattern due to lack of cooling in separating.

The term "fine structure" as used in the invention means a structure having concaves and convexes in a range of several micrometers (μm) to several nanometers (nm).

The term "belt-like mold" as used in the invention means a flat strip that has a fine structure formed on its surface, and which is looped over plural rolls to move endlessly around between the rolls as mentioned above. The belt-like mold preferably has a predetermined strength, and also flexibility to smoothly move in contact with and along the roll side around which the mold is wound. The material for the mold is not limited to a specific one, but is preferably, for example, Ni foil or polyimide film, from the viewpoint of strength and flexibility. Alternatively, the belt-like mold may be a mold member having the fine structure and attached to an endless stainless belt or a resin belt via adhesive.

The supporting roll of the invention rotates together with the movement of the endless belt-like mold, but may itself have a driving mechanism for rotating the endless belt-like mold, and more preferably may have a tensile force adjustment mechanism for adjusting the tensility of the endless belt-like mold. The same goes for the supporting roll for supporting the supporting member.

The cylindrical pressurizing mechanism of the invention includes a pair of opposed cylindrical rolls. The roll is a cylindrical cast product or a cylindrical molded product with a predetermined strength, and is rotatable around a center shaft. The material for the roll of the cylindrical pressurizing mechanism is not limited to a specific one, but is preferably, for example, an alloy, such as stainless, ceramic, or engineering plastic, from the viewpoint of strength and moldability. The cylindrical pressurizing mechanism sandwiches the imprinting object between the belt-like mold and the supporting member, heats and pressurizes the object, while moving the mold, the supporting member, and the object. A thrust force for pressurization is achieved by applying a thrust, such as an air pressure or hydraulic pressure, to both ends of a rotation shaft of the roll. The roll adjusts the pressure applied to the imprinting object, the belt-like mold, and the supporting member by adjustment of the thrust force. Furthermore, a uniform pressurization adjustment mechanism for independently adjusting the pressures on both ends of the rotation shaft may be preferably provided for uniformly pressurizing the entire roll against the mold, the imprinting object, and the supporting member. The cylindrical pressurizing mechanism incorporates therein a heating mechanism, such as a heating wire, an inductive heater, or an infrared heater, for heating the belt-like mold and the imprinting object. The cylindrical pressurizing mechanism also includes a driving mechanism for rotating the belt-like mold and for conveying the imprinting object.

The surface of the cylindrical roll used in the cylindrical pressurizing mechanism of the invention may preferably have an elastic member formed thereon so as to uniformly apply the pressure. Suitable materials for the elastic member formed on the roll surface may include fluoro-rubber, silicone rubber, silicone fluoride rubber, acrylic rubber, nitrile hydroxide rubber, ethylene-propylene rubber, chlorosulfonated polystyrene, epichlorohydrin resin, butyl rubber, urethane rubber, and the like. The materials for the elastic member may also include polyimide (PI), polycarbonate (PC)/acrylonitrilebutadiene styrene (ABS) alloy, polysiloxane dimethylene terephthalate (PCT)/polyethylene terephthalate (PET) copolymerized polybutylene terephthalate (PBT)/polycarbonate (PC) alloy, polytetrafluoroethylene (PTFE), fluorinated ethylene propylene (FEP), polyarylate, polyamide (PA)/acrylonitrile butadiene styrene (ABS) alloy, modified epoxy, modified polyolefin, and the like. Suitable materials for the elastic member may further include various thermosetting resins, such as epoxy resin, unsaturated polyester resin, epoxy-isocyanate resin, maleimide resin, maleimide epoxy resin, cyanate ester resin, cyanate ester epoxy resin, cyanate ester-maleimide resin, phenol resin, diallyl phthalate resin, urethane resin, cyanamide resin, or maleimide cyanamide resin, or a combination of two or more kinds of the aforementioned materials. The elastic member preferably has a heat resistance of about 200° C. to 300° C., and an elastic coefficient of about 100 MPa to 4000 MPa. Further, a high-pressure fluid layer may be formed in use at an outer periphery of the cylindrical pressurizing mechanism in place of the elastic member. A coating for sealing the high-pressure fluid into the outermost surface of the roll of the cylindrical pressurizing mechanism may be formed, and the high-pressure fluid layer may be formed in the coating in use. The coating of the invention is not limited to a specific one, and may be any other coating having flexibility and resistance to heat and pressure. Specifically, the coating may be made of not only metal foil, such as stainless, but also composite material, for example, a rubber sheet reinforced by engineering plastic, such as polyimide film, wire, fiber, or the like. The high-pressure fluid layer of the invention is preferably a layer for allowing hydrostatic pressure to be uniformly applied to the entire contact part between the roll and the belt-like mold or supporting member by pressure applied to the roll. Specifically, materials for the high-pressure fluid layer may include gas, such as air or nitrogen, liquid, such as silicone oil, and gel material, such as polydimethylsiloxane. The high-pressure fluid layer may preferably have its pressure adjustable.

The imprinting object onto which the fine structure of the invention is imprinted is not limited to a specific one, and is selected according to the desired purpose. Specifically, suitable materials for the imprinting object can include in use thermoplastic resin, such as polyethylene, polypropylene, polyvinyl alcohol, polyvinylidene chloride, polyethylene terephthalate, polyvinyl chloride, polystyrene, ABS resin, AS resin, acrylate resin, polyamide, polyacetal, polybutylene terephthalate, glass-reinforced polyethylene terephthalate, polycarbonate, modified polyphenylene ether, polyphenylene sulfide, polyether ether ketone, liquid crystalline polymer, fluorine resin, polyarete, polysulfone, polyether sulfone, polyamide-imide, polyetherimide, and thermoplastic polyimide; thermoset resin, such as phenol resin, melamine resin, urea resin, epoxy resin, unsaturated polyester resin, alkyd resin, silicone resin, diallyphthalate resin, polyamidebismaleimide, and polybisamide triazole; and a mixture of two or more of the aforementioned materials.

Some of such resins for the imprinting object are supplied in the form of single film, or formed on the surface of a supporting base in a thickness of several nanometers (nm) to tens of micrometers (μm). The base is a substrate for supporting a member on which a pattern is to be formed. The material for the base is not limited to a specific one. The base may be any other one having a predetermined strength. The member on which the fine structure is to be formed requires only a flat surface. More preferably, the base has such flexibility as to be continuously supplied, and wound in the form of roll in order to continuously form the pattern. Specifically, various metal material, such as stainless, and plastic or the like, such as a polyimide film, are preferably embodied. The thickness of the imprinting object is not limited to a specific one. The use of the thin film having a thickness of 15.0 μm or less apparently exhibits an effect of preventing the imprinting failure, such as wrinkled traces, according to the present invention.

The supporting member (imprinting object-supporting member) of the invention is preferably a material having coefficients of elasticity and linear expansion similar to those of the belt-like mold so as to achieve the effect of the invention. The supporting member preferably has a belt-like shape so as to perform the continuous imprinting process. Further, the substrate preferably has a flat strip wound around the rolls and which can be rotated. The substrate has a predetermined strength and also flexibility to smoothly move in contact with and along the roll side around which the substrate is wound. The material for the substrate is not limited to a specific one, but is preferably metal, such as Ni or stainless plate, or a polyimide film from a viewpoint of strength and flexibility.

Figure 3:
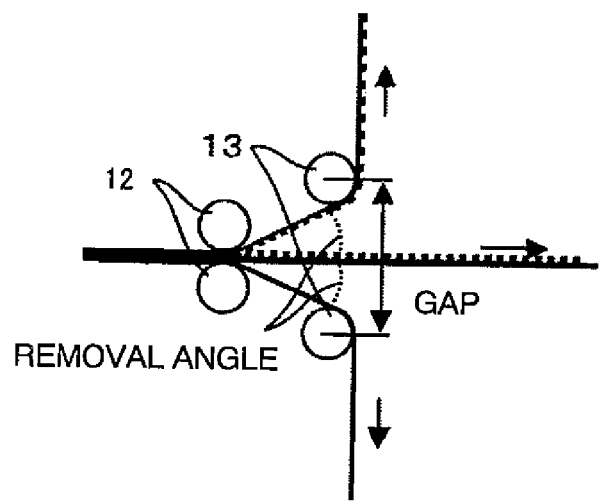
FIG. 3 is a schematic diagram showing details of a separating mechanism of the invention.

The separating mechanism of the invention is adapted to separate the belt-like mold and the supporting member with which the imprinting object has been sandwiched, from the imprinting object. Specifically, the separating mechanism is not limited thereto, and may be any other mechanism that works to change proceeding directions of the belt-like mold and the supporting member by using a pair of rolls serving as a shaft. Specifically, each roll of the separating mechanism is a columnar cast product or a cylindrical molded product with a predetermined strength, and is rotatable around a center shaft. Suitable materials for the separating mechanism are not limited to specific ones, and may preferably include alloy, such as stainless, ceramic, engineering plastic, and the like from the viewpoint of strength and moldability. Each roll of the separating mechanism may have an elastic member formed thereon. Further, the separating mechanism preferably includes a mechanism in which the cylindrical rolls themselves rotate on the axis thereof. As shown in FIG. 3, preferably, a first separating roll 12 and a second separating roll 13 are combined together to adjust a gap of the second separating roll 13, thereby enabling adjustment of a separating angle.

In the invention, the feed roll and the winding roll are rotated to feed and recover the strip-like imprinting object before and after the imprinting process, and have a brake and a driving mechanism for applying a predetermined tensile force to the imprinting object.

The cooling mechanism of the invention is a mechanism that cools the belt-like mold, the imprinting object and the supporting member which are integrated into a layered structure by the cylindrical pressurizing mechanism. The cooling mechanism is adapted to cool the imprinting object to a temperature equal to or less than the glass transition temperature by spraying gas serving as refrigerant against the belt-like mold, the imprinting object, and the supporting member integrated. Alternatively, a cooling roll incorporating therein a cooling mechanism, including water cooling, may be brought into contact with the above-mentioned elements. Additionally, the spraying of gas and the cooling role may be combined.

Example 1

Now, the imprint apparatus and the imprinting method of the invention will be described below. This example employs the apparatus as shown in the schematic diagram of FIG. 1.

First, a manufacturing method of the belt-like mold 1 will be described below. A thermal oxidation film was formed in a thickness of 20 nm on a 8-inch wafer, and then a hole pattern having a diameter of 200 nm, a pitch 400 nm and a depth of 200 nm were formed in the oxidation film by a photolithography process. Then, a replica original plate of 1000 μm in thickness was formed by a Ni electroforming technique using the 8-inch wafer as a master original plate. A Ni replica sheet of 100 μm in thickness was formed from the replica original plate by the Ni electroforming technique. Then, 20 mold sheets, each having dimensions of 150 mm by 100 mm, were cut out of the Ni replica sheet.

Then, a SUS belt having a width of 170 mm, a peripheral length of 200 m and a thickness of 100 μm was prepared. The mold sheet having dimensions of 150 mm by 100 mm was affixed to the entire peripheral surface of the SUS belt by an epoxy-based adhesive sheet thereby to manufacture the belt-like mold 1 having fine holes of 200 nm in diameter and 200 nm in depth.

The belt-like mold 1 was mounted on the apparatus as shown in FIG. 1. Each of the upper roll 2 and the lower roll 6 used in the cylindrical pressurizing mechanism of the apparatus, each having a diameter of 300 mm, had the outermost surface coated with heat resisting silicone rubber serving as an elastic member in a thickness of 2 mm. The pressurizing mechanism in use incorporated therein an inductive heater having a temperature distribution of ±2° C. in an effective imprinting area of 200 mm in width, and a maximum service temperature of 200° C.

The SUS belt having the width of 170 mm, the peripheral length of 200 m, and the thickness of 100 μm was attached to the apparatus to serve as the supporting member 5.

A distance from the cylindrical pressurizing mechanism of the apparatus to the separating mechanism was set to 500 mm. A cooling mechanism 11 was mounted on the device for allowing the refrigerant to circulate through a portion near the pressurizing mechanism, and for blowing cooled air to an integrated part of the belt-like mold, the imprinting object, and the supporting member.

In this example, a strip-like polycarbonate sheet of 90 μm in thickness and 150 mm in width was used as the imprinting object.

Next, an air pressure of a plunger for supporting shafts of the upper roll 2 and the lower roll 6 of the cylindrical pressurizing mechanism was adjusted such that the pressure of the pressurizing mechanism was 1.5 MPa. Then, the surface temperatures of the upper roll 2 and the lower roll 6 were set to 170° C. The rotation velocity of the pressurizing mechanism was adjusted such that the belt-like mold, the imprinting object, and the supporting member moved at a velocity of 300 mm/min.

By use of the above-mentioned apparatus under the conditions described, the pattern was imprinted onto the polycarbonate sheet. The shape of the thus-obtained pattern was evaluated by a survey test using an atomic force microscope. The result is shown in Table 1. In this example, protrusions having a diameter of 200 nm and a height of 200 nm were able to be formed at a velocity of 7.5 cm$^2$/s without causing the imprinting failure, such as a wrinkled trace.

Example 2

First, 20 sheets of Ni plating foil, each having dimensions of 100 mm by 150 mm, were produced by the same method as that in Example 1, and then bonded together by laser spot welding to manufacture a belt-like mold of 2 m in peripheral length. The thus-obtained belt-like mold was mounted on the same device as that in Example 1. The Ni belt having of 100 μm in thickness, 150 mm in width, and 2 m in peripheral length was used as the supporting member. By use of these elements, the pattern was imprinted onto a polycarbonate sheet by the same method as that in Example 1. The shape of the thus-obtained pattern was evaluated by a survey test using the atomic force microscope. The result is shown in Table 1. In this example, protrusions having a diameter of 200 nm and a height of 200 nm were able to be formed at a velocity of 7.5 cm²/s without causing the imprinting failure, such as a wrinkled trace.

Example 3

Figure 4:
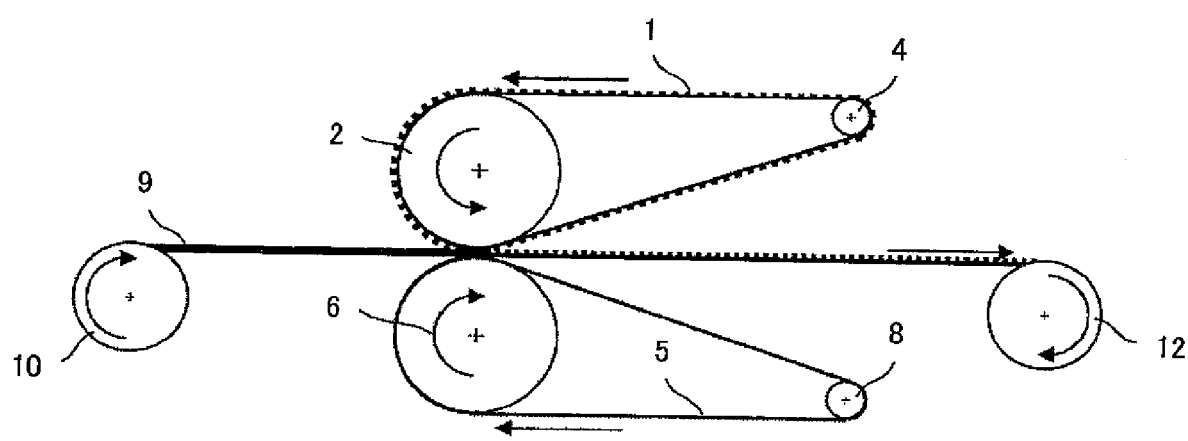
FIG. 4 is a schematic diagram of an imprint apparatus in one example of the invention.
Figure 5:
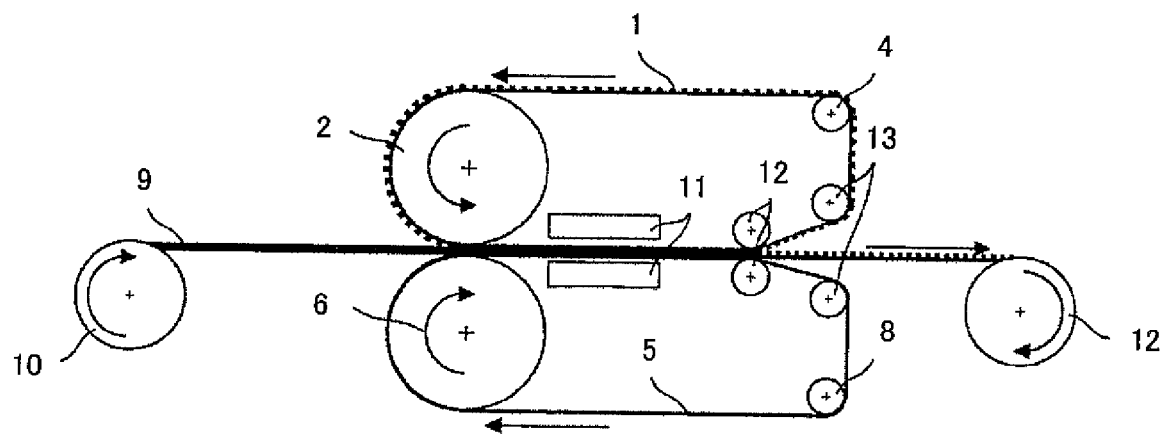
FIG. 5 is a schematic diagram of an imprint apparatus in another example of the invention.

FIG. 4 shows a schematic diagram of the imprinting apparatus used in this example. The imprinting apparatus of this example employed two of the upper roll 2 of the cylindrical pressurizing mechanism and the supporting roll 4 to serve as a roll for supporting and fixing the belt-like mold 1. Further, the imprinting apparatus of this example employed two of the lower roll 6 of the cylindrical pressurizing mechanism and the supporting roll 8 to serve as a roll for supporting and fixing the belt-like mold 1. The imprinting apparatus omitted the separating mechanism and the cooling mechanism used in the apparatus of Example 1. The imprinting object 9 is rapidly removed or separated from the belt-like mold 1 and the supporting member 5 after being heated and pressurized by the upper roll 2 and the lower roll 6 of the cylindrical pressurizing mechanism.

The pattern was imprinted by the apparatus of this example using the same belt-like mold, imprinting object, and supporting member as those in Example 1 under the same conditions as those in Example 1, and the shape of the pattern was evaluated. The shape of the thus-obtained pattern was evaluated by a survey test using an atomic force microscope. The result is shown in Table 1. In this example, protrusions having a diameter of 200 nm and a height of 200 nm were able to be formed at a velocity of 7.5 cm²/s without causing the imprinting failure, such as a wrinkled trace.

Example 4

FIG. 4 is a schematic diagram of the imprinting apparatus used in this example. The apparatus used in Example 1 as shown in FIG. 1 used the separating mechanism constructed of a pair of separating rolls (the upper roll 3 and the lower roll 7 of the separating mechanism). In contrast, the apparatus of this example used another separating mechanism that included a combination of the first separating roll 12 and the second separating roll 13, and whose removal angle was adjustable by adjusting a gap of the second separating roll 13. The imprinting apparatus of this example has the same structure as that of the apparatus used in Example 1 except for the separating mechanism.

The pattern was imprinted by the apparatus of this example using the same belt-like mold, imprinting object, and supporting member as those in Example 1 under the same conditions as those in Example 1, and the shape of the pattern was evaluated. The shape of the thus-obtained pattern was evaluated by a survey test using the atomic force microscope. The result is shown in Table 1. In this example, protrusions having a diameter of 200 nm and a height of 200 nm were able to be formed at a velocity of 7.5 cm²/s without causing the imprinting failure, such as a wrinkled trace.

The separating mechanism of the apparatus is adapted to be capable of adjusting the removal angle. Thus, the separating mechanism can adjust the removal angle according to the material of the imprinting object, the size and shape of the pattern to be imprinted, and the like, thereby imprinting the pattern with high accuracy.

Comparative Example 1

Figure 6:
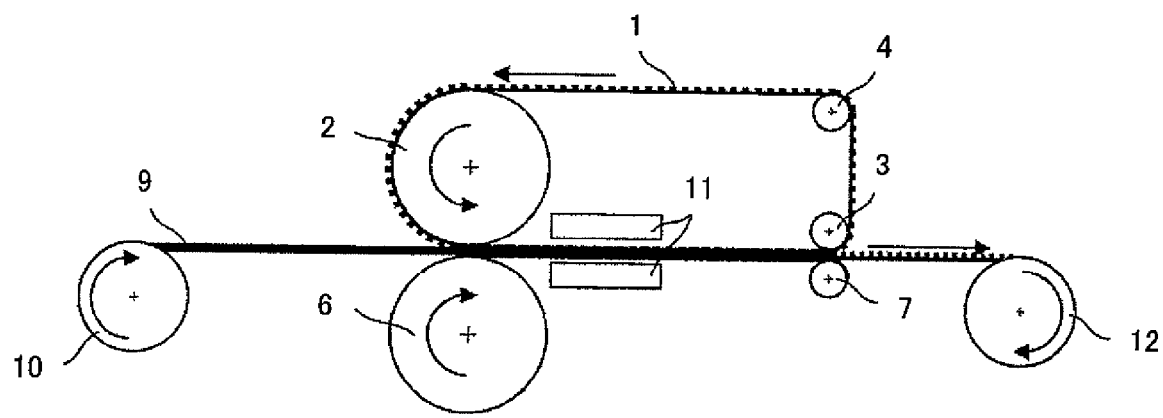
FIG. 6 is a schematic diagram of an imprint apparatus in a comparative example.

As shown in FIG. 6, the pattern was imprinted using the same apparatus as that of Example 1 by the same method as that of Example 1 except that the supporting member was not used, and then the shape of the thus-obtained pattern was evaluated. The result is shown in Table 1. In this example, protrusions having a diameter of 200 nm and a height of 200 nm were able to be formed at a velocity of 7.5 cm²/s, but causing wrinkled traces on the surface of the imprinting object.

Comparative Example 2

Figure 7A:
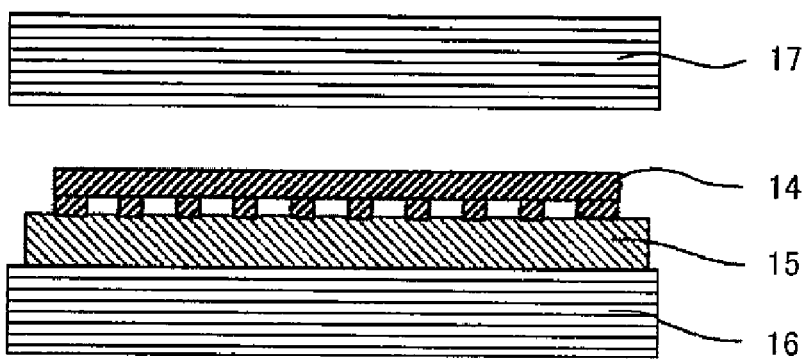
FIG. 7 is a schematic diagram showing an imprinting method in a parallel flat plate type structure.
Figure 7B:
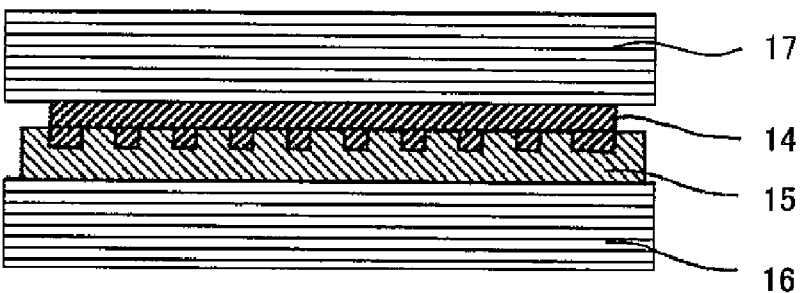

FIG. 7 shows a schematic diagram of the imprinting method in a parallel flat plate type structure. First, as shown in FIG. 7A, the same polycarbonate sheet as that of Example 1 which was cut into dimensions of 180 mm by 180 mm was set as the imprinting object 15 on the lower stage 16 of the press device adapted to be capable of pressurizing and heating. The Ni mold 14 manufactured to be cut into 150 mm by 100 mm by the same method as that of Example 1 was put on the imprinting object 15. Then, after vacuum deairing, the lower stage 16 and the upper stage 17 were heated up to 165° C., and then pressurized and heated for 300 seconds at a pressure of 4 MPa as shown in FIG. 7B.

Then, the sample was cooled up to 35° C. while being pressurized, and then taken out. The mold was removed from the imprinting object to form the pattern, the shape of which was evaluated. The result is shown in Table 1. The imprinting of the pattern having dimensions of 150 mm by 150 mm took 1820 seconds in total, specifically, 720 seconds to heat from a room temperature to 165° C., 300 seconds to pressurize and heat the sample, and 800 seconds to cool the sample from 165° C. to 35° C. The throughput was 0.124 cm²/s.

The invention can be applied to various fields of forming a fine structure on a surface, for example, a biodevice, an energy device, an optical component, a recording medium, and the like.

[Table 1]

TABLE 1

| | Example 1 | Example 2 | Example 3 | Example 4 | Comparative Example 1 | Comparative Example 2 |
|---|---|---|---|---|---|---|
| Imprinting velocity cm²/s | 7.5 | 7.5 | 7.5 | 7.5 | 7.5 | 0.124 |
| Existence of wrinkled trace | NO | NO | NO | NO | SOME | NO |
| Imprinting of fine pattern | O (OK) | O (OK) | O (OK) | O (OK) | O (OK) | O (OK) |

What is claimed is:

1. An imprint apparatus for forming fine structure lithography onto a surface of an imprinting object, comprising:
   a belt-like mold having a fine structure for imprint lithography formed on a surface of the belt-like mold;
   a cylindrical pressurizing mechanism including a pair of opposed rolls with a heater incorporated in the rolls for pressing the belt-like mold against the surface of the imprinting object while heating the belt-like mold and the imprinting object;
   a supporting member for supporting the imprinting object at a position between the rolls of the cylindrical pressurizing mechanism; and
   a separating mechanism for separating the belt-like mold and the supporting member from the imprinting object at a position downstream of the cylindrical pressurizing mechanism position, the separating mechanism comprising a first pair of opposed separating rolls at a position downstream of the cylindrical pressurizing mechanism and a second pair of opposed separating rolls at a position downstream of the first pair of opposed separating rolls, wherein a gap between the second pair of opposed separating rolls is adjustable to be greater than a gap between the first pair of opposed separating rolls to provide an adjustable separating angle of the belt-like mold and the supporting member from the imprinting object,
   wherein the belt-like mold, the imprinting object, the supporting member and the separating mechanism are configured to move to the cylindrical pressurizing mechanism in a mutually non-contact state, then at the position between the rolls, be pressed by the rolls of the cylindrical pressurizing mechanism while being heated with direct heat transfer from the rolls in a state where the imprinting object is positioned between the belt-like mold and the supporting member, and then be separated from each other by the separating mechanism at the position downstream of the cylindrical pressurizing mechanism position.

2. The imprint apparatus according to claim 1, wherein the supporting member has a belt-like shape.

3. The imprint apparatus according to claim 1, wherein material for the supporting member is the same as that for the belt-like mold.

4. The imprint apparatus according to claim 1, wherein the material for the supporting member has flexibility.

5. The imprint apparatus according to claim 1, wherein the imprinting object is a strip-like film having a thickness of 100 μm or less.

6. The imprint apparatus according to claim 1, wherein the cylindrical pressurizing mechanism has an elastic member formed on a surface thereof.

7. The imprint apparatus according to claim 1, further comprising:
   an imprinting object-feeding mechanism for feeding the imprinting object to the cylindrical pressurizing mechanism; and
   a mold-supporting mechanism for supporting the belt-like mold up to the cylindrical pressurizing mechanism in a non-contact state with respect to the imprinting object.

8. The imprint apparatus according to claim 7, wherein the mold-supporting mechanism has a plurality of rolls including one of the rolls of the cylindrical pressurizing mechanism, and supports the belt-like mold so as to endlessly move the belt-like mold.

9. The imprint apparatus according to claim 1, wherein a cooling mechanism for cooling the imprinting object is disposed between the cylindrical pressurizing mechanism and the separating mechanism.

* * * * *